(12) United States Patent
Schuur et al.

(10) Patent No.: US 6,246,291 B1
(45) Date of Patent: Jun. 12, 2001

(54) COMMUNICATION DEVICE WITH PHASE CONTINUOUS SYNCHRONIZATION TO AN EXTERNAL NETWORK

(75) Inventors: Cornelis C. M. Schuur, Eindhoven; Hermanus J. M. Vos, Nijmegen, both of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/257,081

(22) Filed: Feb. 24, 1999

(30) Foreign Application Priority Data

Feb. 25, 1998 (EP) .................................................. 98200595

(51) Int. Cl.[7] ................................. H03L 7/00; H04L 7/00
(52) U.S. Cl. ............................ 331/1 R; 331/46; 370/350; 375/356; 375/354; 327/141; 327/151; 327/160
(58) Field of Search ..................... 331/1 R, 46; 375/356, 375/354; 327/141, 151, 160; 370/350

(56) References Cited

U.S. PATENT DOCUMENTS

| 4,803,705 | * | 2/1989 | Gillingham et al. .................. 531/1 A |
| 5,684,788 | * | 11/1997 | Krech .................................... 375/356 |

FOREIGN PATENT DOCUMENTS

0613276A1    8/1994  (EP) .

* cited by examiner

Primary Examiner—Arnold Kinkead

(57) ABSTRACT

In a method of synchronizing a local oscillator to a main oscillator signal in a network, the local oscillator signal has a phase shift relative to and upon appearance of the main oscillator signal. The phase shift is used as a reference phase shift between the local oscillator signal and the main oscillator signal to synchronize the local oscillator signal. Initially the reference phase shift is fixed.

15 Claims, 3 Drawing Sheets

COMMUNICATION DEVICE WITH PHASE CONTINUOUS SYNCHRONIZATION TO AN EXTERNAL NETWORK

BACKGROUND OF THE INVENTION

1. Field of the Invention

The present invention relates to a method of synchronizing a local oscillator signal to a main oscillator signal in a network.

The present invention also relates to a device for performing a method of the invention, and a communication device comprising such a device.

2. Description of the Related Art

Such a method and device are known from European Patent Application EP-A-0613276. The known method and device perform synchronisation between a central unit and several base stations by means of transferring synchronisation information possibly including sync opportunity information and time delay information. This enables a base station receiving the synchronisation information to detect with which time delay after receipt of the sync opportunity information synchronisation of its clock is actually to be carried out. A clock counter in each respective base station is preloaded to a respective value defined by the transmitted delay information. At zero count all base station clocks synchronize momentarily. Similar synchronization may take place with a given reference signal. It is a disadvantage of the known method and device that, if handsets coupled to respective base stations are communicating with one another, synchronisation after a temporary disruption of information from the central unit and performed in a way as indicated above, will lead to a possible loss of synchronisation of mutually communicating handsets upon reappearance of the sync information. Such a situation can similarly arise in a DECT (Digital European Cordless Telephone) protocol system, where a connection to an ISDN network may be subjected to a temporarily disappearing and/or reappearing reference signal given by the ISDN network. Neither case may, however, lead to an interruption, or disturbance of or a phase jump in ongoing communication between, for example, the handsets.

SUMMARY OF THE INVENTION

Therefore, it is an object of the present invention to provide a method and device presenting a solution to the general problem of resynchronising clocks in devices of a network.

To this end, in a method of the invention, the phase shift is being used as an at least initially fixed reference phase shift between the thus synchronized local oscillator signal and the main oscillator signal. In a device of the invention, the synchronizing means comprise means for fixing the phase shift and synchronizing the future oscillator signal based on said fixed phase shift. It is an advantage of the method and device according to the invention that the phase shift experienced after reappearance of the main oscillator signal is simply being used to base the synchronised local oscillator signal thereon, as a result of which no interruption or phase jumps will occur. Synchronisation now takes place in a way that an initially fixed phase shift is maintained between the main oscillator signal and the local oscillator signal. Thus after applying the method according to the invention, processing based on the synchronised local oscillator signal in the device has a fixed delay relative to processing based on the main oscillator signal. In a DECT environment this has the additional advantage that handsets communicating through the base station, where a further handset starts communication through the ISDN network which makes the main oscillator signal reappear, will now not be disturbed by the smooth synchronisation method according to the invention.

In an embodiment of the method according to the invention the initial phase shift is being determined upon reappearance of the main oscillator signal, whereafter the initial phase shift is substantially maintained for a period of time. Easy control is possible in a further embodiment according to the present invention, wherein the initial phase shift is being controlled step-by-step by influencing the dividing ratio of a reference counter.

In a further embodiment of the method according to the present invention, wherein the initially fixed reference phase shift is being diminished by gradually controlling the frequency of the local oscillator accordingly, timing margins can be recovered and gained in order to be capable of accommodating time delays or time shifts caused by data, cable or air delays.

BRIEF DESCRIPTION OF THE DRAWING

At present the method and device according to the invention will be elucidated further together with their additional advantages while reference is made to the appended drawing, wherein like components are referred to by like reference numerals. In the drawing.

Figure 1:
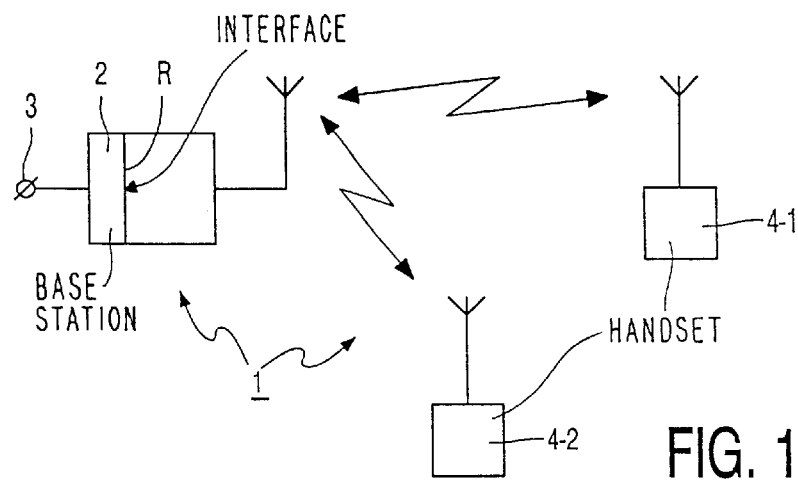
FIG. 1 shows a schematic view of a simplified communication device according to the invention having a base station and several handsets.

The present invention will now be described, by way of example, with reference to the accompanying drawings.

DETAILED DESCRIPTION OF THE DRAWING

FIG. 1 shows a communication device 1 exemplified as a base station 2 coupled to a line, such as a telephone line 3 and two handsets 4-1, 4-2 shown generally capable of communicating with each other by air through base station 2, but also capable of communicating with other stations or networks (not shown) coupled to the line 3. Such a network could be an ISDN network. The base station comprises several interfaces, a so called R-interface to be described hereafter being indicated therein.

Figure 2:
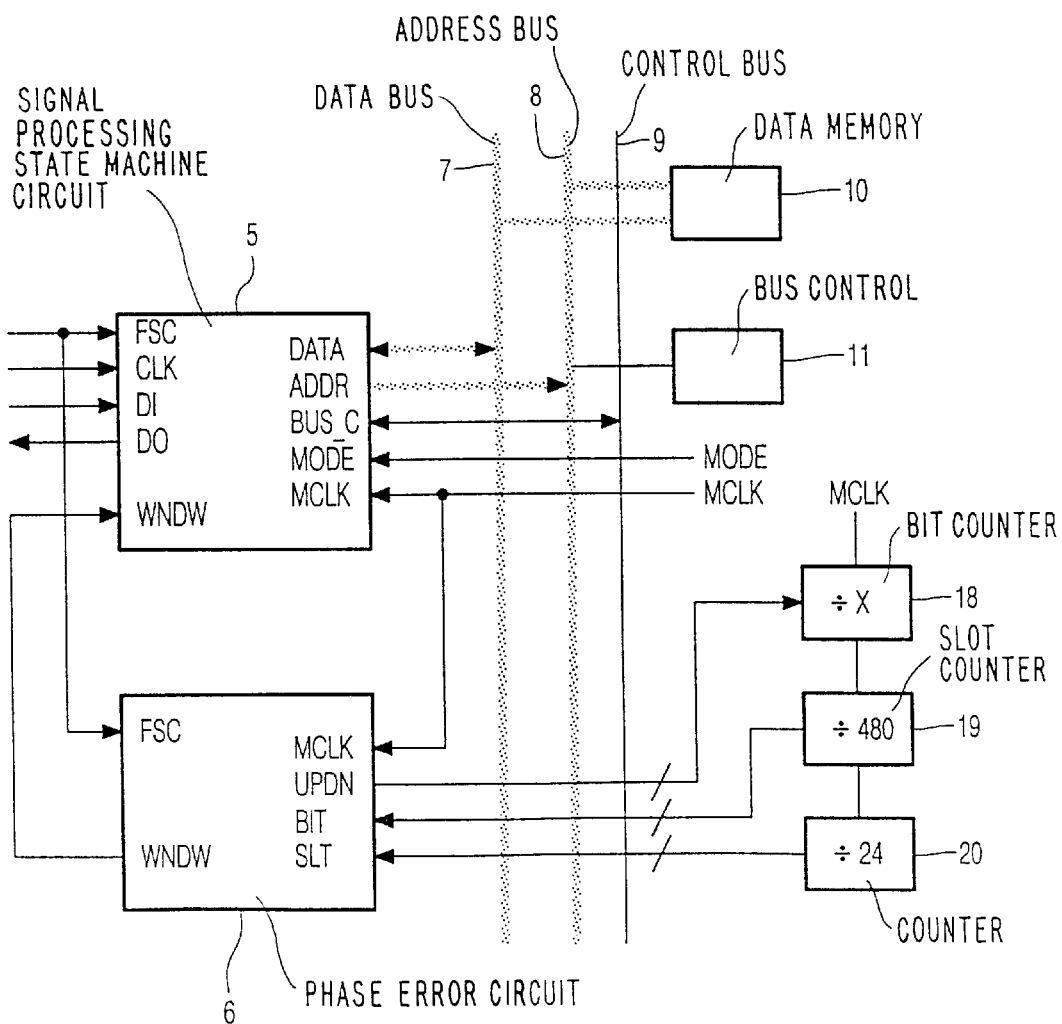
FIG. 2 shows an embodiment of an R-interface for application in the communication device shown in FIG. 1.

FIG. 2 shows a part relevant to the present description of the R-interface at least containing synchronisation signals FSC and CLK. These synchronisation signals FSC and CLK generated across the line 3 by the ISDN network disappear as soon as the base station, which is a DECT base station, loses its logical signal connection with the ISDN network. If during the loss of this connection two or more handsets are communicating with each other while a further handset sets up a connection across the R-interface, said synchronisation signals FSC and CLK reappear, whereafter the base station 2 will attempt to synchronise itself to FSC. This may cause a disturbing phase jump and an accidental disruption in the communication between the handsets 4-1, 4-2 if no precautionary measures are taken.

Figure 3:
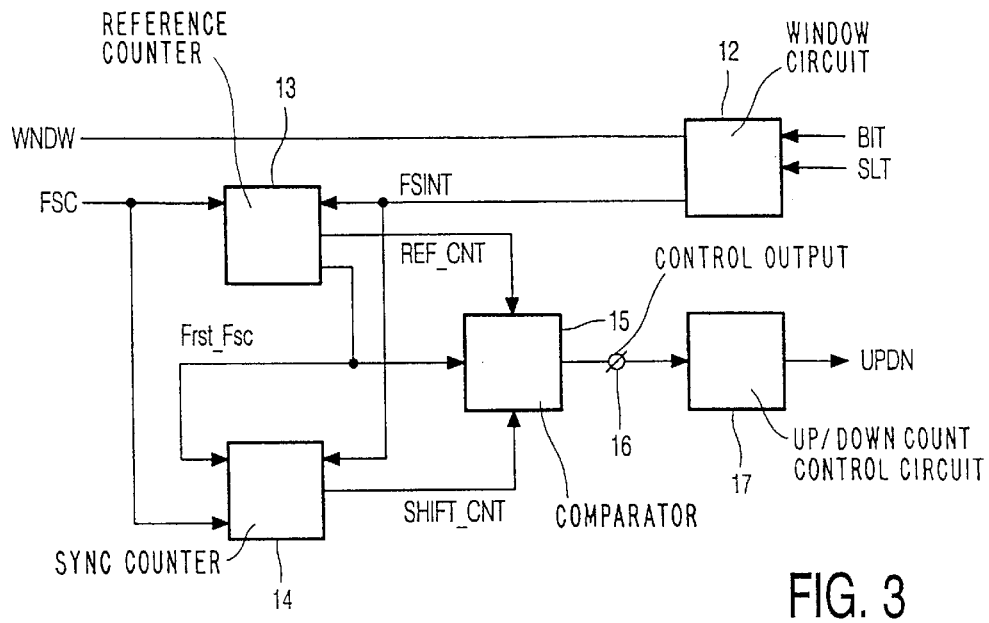
FIG. 3 shows an embodiment of a phase error circuit for application in the interface of FIG. 2.
Figure 4:
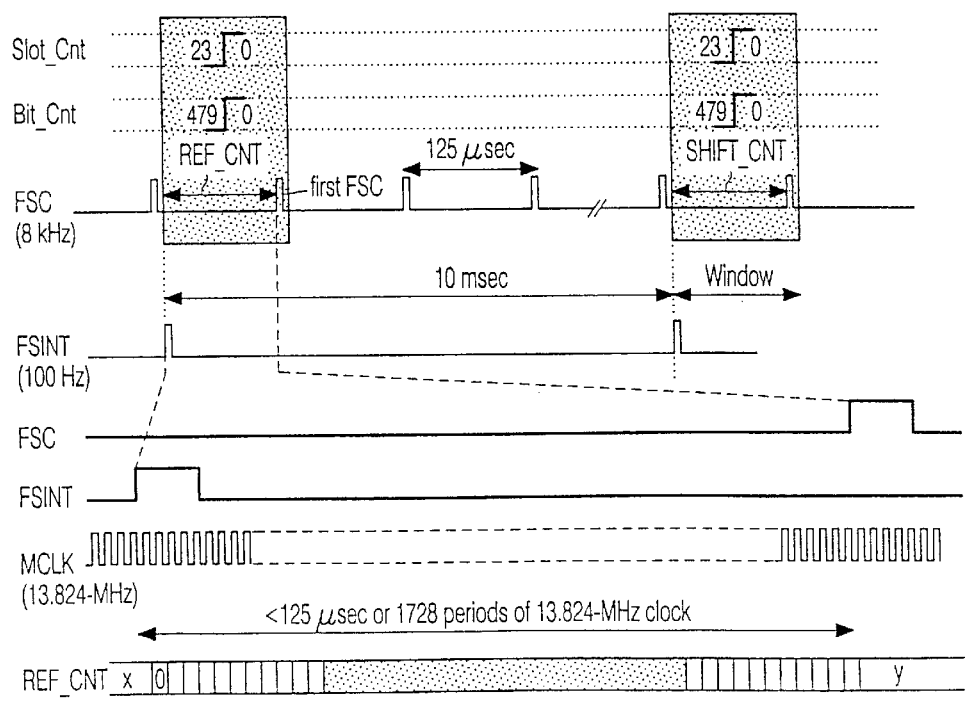
FIG. 4 shows a timing diagram of signals used in the method according to the invention.

In ISDN communication, FSC is a 8 KHz signal as shown in FIGS. 2–4. FIG. 2 shows an implementation of the R-interface. It contains means for synchronization embodied as a signal processing state machine circuit 5 and a phase error circuit 6 connected to data, address and control buses 7, 8 and 9, respectively. A data memory 10 and a bus control 11 are also connected to the buses 7, 8, 9. The phase error circuit 6 is elucidated further in FIG. 3. FSINT shown therein is an internal 100 Hz signal used in the base station 2 providing a pulse every 10 msec. FSINT is an output signal of a window circuit 12 included in the phase error circuit 6. From a local clock MCLK having a frequency of, for example, 13.824 MHz, pulse signals BIT and SLT respectively, are derived and used in the window circuit 12. A reappearing FSC signal has a first FSC pulse, whose phase shift REF_CNT is determined relative to the latest FSINT pulse in reference counter 13 also included in the phase error circuit 6. Furthermore, the circuit 6 contains a sync counter 14 and a comparator 15 coupled to phase shift outputs REF_CNT and SHIFT_CNT of both 11-bit counters 13 and 14 in order to compare these counted phase shifts for providing a control signal on its control output 16, if a phase difference is being detected between them. The control can be such that the initial phase shift REF_CNT is being maintained as a future reference for controlling SHIFT_CNT, such that the latter is being used as a basis for effecting synchronisation between the local oscillator signal FSINT and the network or main oscillator signal FSC. Control output 16 is connected to an up/down count control circuit 17 for providing a control signal UPDN which influences a generally programmable dividing factor of a bit counter 18. In the above case where, the MCLK frequency is 13.824 MHz, the dividing factor of the bit counter 18 equals 12 and can be programmed to be, for example, 11, 12, or 13 depending on the control signal UPDN. The bit counter 18 thus provides an output signal having a frequency of 1.152 MHz, being a bit frequency. A slot counter 19, whose dividing factor is 480, provides the slot frequency of 2.4 KHz which further divided by counter 20 having a dividing factor equalling 24 provides the 100 Hz for FSINT as mentioned above. Processing of a possible call from said further handset in base station 2 is now to be based on FSINT which is synchronised phase shifted over SHIFT_CNT, so that the mutually communicating handsets 4-1 and 4-2 maintain contact and are not disturbed by the thus presented phase shifted synchronisation method. In the embodiment described the phase shift is actually measured once every 10 msec, whereby the measurement is carried out in a time window that is 125 $\mu$sec wide. The window could extend from 62.5 $\mu$sec before a signal Bit_Cnt=0 and Slot_Cnt=0 to 62.5 $\mu$sec thereafter. If a phase difference is measured in the window, this can be eliminated by influencing the dividing factor of bit counter 18 accordingly during one or more periods of time.

Each frame of 10 msec comprises 24 slots. Each slot lasts approximately 416.6 $\mu$sec (slot frequency is 2.4 KHz). Each slot contains 480 bits and comprises separate slot synchronisation information, maintenance information, 80 speech samples of approximately 277.7 $\mu$sec in a so called B-field, and free shift time for accommodating time delays. The 80 speech samples are taken from 10 msec of speech, whereby the samples are read into a ring buffer (not shown) relatively slowly and read out in a so called Burst Mode by Burst Mode logic to fit into the 277.7 $\mu$sec.

Figure 5:
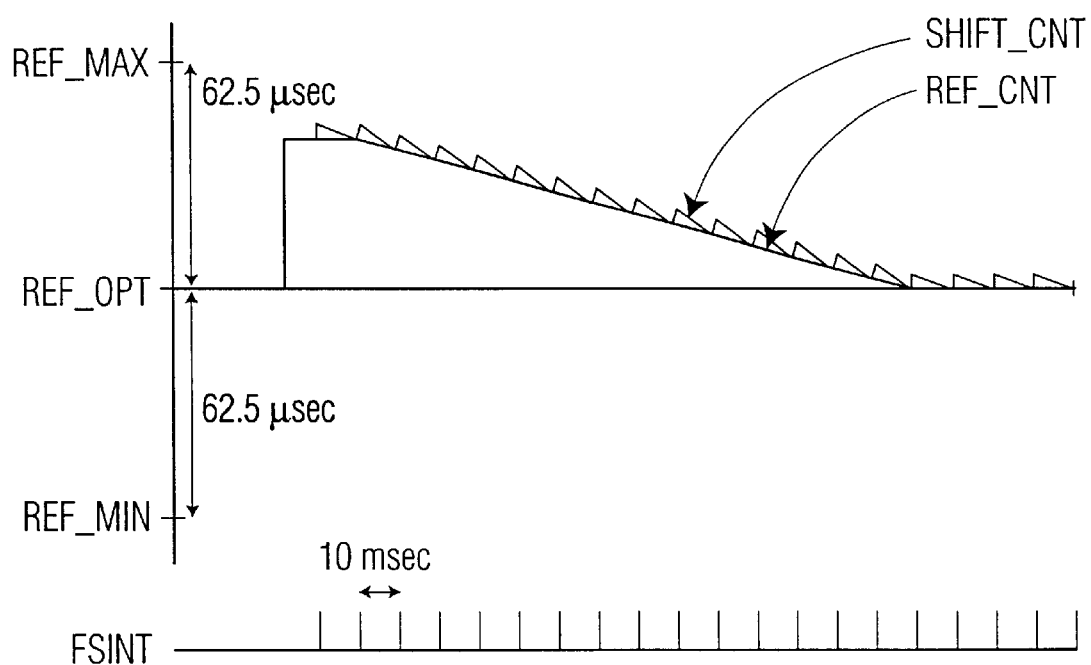
FIG. 5 shows graphs of signals used in the further improved method and device according to the invention.

Although it will be clear from the above that manipulation of the dividing factor of bit counter 18 takes place for making SHIFT_CNT equal to REF_CNT in FIG. 4, FIG. 5 shows in a graph the step-by-step way wherein the count REF_CNT in reference counter 13 is forced to move slowly in the direction of a value REF_OPT, which moving will thus be followed by SHIFT_CNT. Finally, SHIFT_CNT will be around zero which offers the additional advantage that there is more free shift time in each slot available to accommodate possible shifts in the B-field timing because of possible cable delays or air delays. Changing of REF_CNT can be done either under the control of a hardware state machine or under the control of a software state machine. A practical example of this improved method will be given. Suppose that a maximum initial phase shift of +62.5 $\mu$sec or 72 bit times is measured. Assume that in order not to lose connection with handsets, REF_CNT should not change faster than one bit time per 10 msec. In that case, REF_CNT is moved from REF_MAX to REF_OPT in 720 msec. Depending on the severity of the initial timing violation, that violation will be audible only for a fraction of 720 msec.

In view of the foregoing it will be evident to a person skilled in the art that various modifications may be made within the spirit and the scope of the present invention as hereinafter defined by the appended claims and that the present invention is thus not limited to the examples provided.

What is claimed is:

1. A communication device comprising:
   a local oscillator for providing a local oscillator signal, and;
   means for synchronizing the local oscillator signal with a main oscillator signal, said means for synchronizing comprising:
   counter means for counting an initial phase shift and following phase shifts between the local oscillator signal and the main oscillator signal,
   means for forming a fixed phase shift and synchronizing a future oscillator signal based on said fixed phase shift, and
   comparing means coupled to the counter means for comparing the fixed phase shift with the following phase shifts and providing a control signal in dependence on the comparison.

2. The communication device according to claim 1 comprising a station in a telephone network.

3. A method of synchronizing a first signal to a synchronization signal, the first signal synchronizing a second signal and the synchronization signal synchronizing the first signal, the method comprising:
   measuring a value of a phase shift between the first signal and the synchronization signal;
   maintaining the value of the phase shift to a reference value, the reference value initially being the value of the phase shift measured upon appearance of the synchronization signal.

4. The method of synchronizing of claim 3, wherein the reference value is constant for a given period of time.

5. The method of synchronizing of claim 3, further comprising gradually diminishing the reference value.

6. A device comprising:
   a local oscillator providing a first signal, the first signal synchronizing a second signal;
   a measurement arrangement for measuring a value of a phase shift between the first signal and a synchronization signal, the synchronization signal synchronizing the first signal;
   a counter for storing a reference value, the reference value initially being the value of the phase shift measured by the measurement arrangement upon appearance of the synchronization signal, and;

a synchronizer for maintaining the value of the phase shift to the reference value.

7. The device of claim 6, wherein the synchronizer further comprises:

a comparator coupled to the counter and to the measurement arrangement for comparing the value of the phase shift with the reference value and for providing a control signal based on the comparison.

8. The device of claim 7, wherein the local oscillator comprises a second counter for providing the first signal from a constant clock signal on the basis of a dividing ratio.

9. The device of claim 8, wherein the dividing ratio is adjustable in response to the control signal.

10. The device of claim 6, wherein the reference value is gradually diminished.

11. A system comprising:

a first device for providing a first signal, the first signal synchronizing a second signal;

a second device for providing the second signal;

a network for providing a synchronization signal, the synchronization signal synchronizing the first signal; and, the first device comprises a local oscillator providing the first signal;

a measurement arrangement for measuring a value of a phase shift between the first signal and the synchronization signal;

a counter for storing a reference value, the reference value initially being the value of the phase shift measured by the measurement arrangement upon appearance of the synchronization signal, and;

a synchronizer for maintaining the value of the phase shift to the reference value.

12. The system of claim 11, wherein the first device is a base communication station, the second device is a mobile communication station and the network is an ISDN network.

13. A device for synchronizing a local oscillator signal comprising:

a local oscillator for providing the local oscillator signal, and means for synchronizing the local oscillator signal with a main oscillator signal, the means for synchronizing comprising:

means for forming a fixed phase shift and synchronizing a future oscillator signal based on said fixed phase shift, counter means for counting an initial phase shift and following phase shifts between the local oscillator signal and the main oscillator, signal, and comparator means coupled to the counter means for comparing the fixed phase shift with the following phase shifts and providing a control signal from the comparison.

14. The device according to claim 13, wherein the counter means have a programmable dividing ratio by applying the control signal on a dividing ratio control input of the counter means.

15. The device according to claim 13, wherein the means for synchronizing further comprise a hardware or software implemented state machine coupled to the counter means for influencing a division ratio of the counter means step by step.

* * * * *